(12) United States Patent
Wallner et al.

(10) Patent No.: US 10,580,684 B2
(45) Date of Patent: Mar. 3, 2020

(54) SELF-ALIGNED SINGLE DIFFUSION BREAK FOR FULLY DEPLETED SILICON-ON-INSULATOR AND METHOD FOR PRODUCING THE SAME

(71) Applicant: GLOBALFOUNDRIES Inc., Grand Cayman (KY)

(72) Inventors: Jin Wallner, Albany, NY (US); Katherina Babich, Cold Spring, NY (US); Sunil Kumar Singh, Mechanicville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/950,907

(22) Filed: Apr. 11, 2018

(65) Prior Publication Data
US 2019/0318955 A1    Oct. 17, 2019

(51) Int. Cl.
*H01L 21/762*   (2006.01)
*H01L 29/06*    (2006.01)
*H01L 29/66*    (2006.01)

(52) U.S. Cl.
CPC .... *H01L 21/76224* (2013.01); *H01L 29/0649* (2013.01); *H01L 29/66545* (2013.01)

(58) Field of Classification Search
None
See application file for complete search history.

(56) References Cited

U.S. PATENT DOCUMENTS

| 7,942,945 | B1 | 5/2011 | Zentye et al. |
| 8,609,510 | B1 | 12/2013 | Banna et al. |
| 9,496,182 | B2* | 11/2016 | Tung ................. H01L 21/82381 |
| 2009/0091038 | A1 | 4/2009 | Chen et al. |
| 2017/0047317 | A1* | 2/2017 | Lin .................... H01L 29/66545 |

OTHER PUBLICATIONS

Neirynck et al., "The addition of surfactant to slurry for polymer CMP: effects on polymer surface, removal rate and underlying Cu", vols. 290-291, Dec. 15, 1996, abstract retrieved on Apr. 11, 2018 from https://www.sciencedirect.com/science/article/pii/S0040609096090335, pp. 447-452.

* cited by examiner

*Primary Examiner* — Chandra Chaudhari
(74) *Attorney, Agent, or Firm* — Ditthavong & Steiner P.C.

(57) ABSTRACT

A method of forming an SDB that is self-aligned to a dummy gate and the resulting device are provided. Embodiments include providing a plurality of gates over a SOI layer above a BOX layer, each gate having a pair of sidewall spacers and a cap layer, and a raised S/D epitaxial regions over the SOI layer between each gate; removing a gate of the plurality of gates and a portion of the SOI layer exposed by the removing of the gate, and a portion of the BOX layer underneath the SOI layer, the removing forms a trench; forming a liner of a first dielectric material over and along sidewalls of the trench; and filling the trench with a second dielectric material.

7 Claims, 14 Drawing Sheets

US 10,580,684 B2

SELF-ALIGNED SINGLE DIFFUSION BREAK FOR FULLY DEPLETED SILICON-ON-INSULATOR AND METHOD FOR PRODUCING THE SAME

TECHNICAL FIELD

The present disclosure generally relates to designing and fabricating semiconductor devices, such as integrated circuits (ICs). The present disclosure is particularly applicable to the formation of a single diffusion break (SDB).

BACKGROUND

Multiple electronic components in ICs must be electrically isolated in order to ensure proper device functionality. Typically isolation is achieved by breaking a diffusion 'active' region and forming a trench in the substrate which is filled with dielectric materials, e.g., silicon oxide or silicon nitride. Devices are formed on the 'active' semiconductor substrate regions which are defined by isolation structures. Among isolation structures, shallow trench isolation (STI) structures are commonly used in modern IC fabrication process.

Various semiconductor device layout configurations employing a SDB and a double diffusion break (DDB) isolation schemes have been developed, as illustrated in FIG. 1A. The SDB cell layout reduces the circuit area by one contacted poly pitch (CPP) vs. DDB cell layout thus is highly desirable to achieve a high-density functional IC design on a smaller chip area. Formation of SDB isolation in high volume manufacturing, however, represents a number of technical challenges: (a) poor epitaxial (EPI) growth at the active-STI boundary; (b) poor silicide formation due to the poor EPI growth and faceting; (c) increased risk of contact to substrate shorts 'contact punch though' wherein the CA punches through the source/drain (S/D) region and at least partially extends into the substrate and (d) possible channel strain loss. In one instance, fully depleted silicon-on-insulator (FDSOI) and ultra-thin silicon-on-insulator (UTSOI) devices with ultra-thin Si layer are even more susceptible to the SDB challenges as compared to bulk Si devices.

FIG. 1B shows a cross-sectional view of a FDSOI device in SDB layout. Referring to FIG. 1B, a SDB isolation region 101 is formed within a center portion of a silicon-on-insulator (SOI) layer 103, a buried oxide (BOX) layer 105 and silicon (Si) substrate 107 of a HKMG FDSOI device 100 to separate the active regions 109. The SDB isolation region 101 formed underneath the dummy gate 111 prior to raised S/D 113 formation using a standard integration method results in faceted S/D profile (not shown for illustrative convenience) along the boundary of STI 101 leading to poor EPI junction growth, poor silicide formation, increased risk of contact to substrate shorts, and increased device variability for the active devices.

A need therefore exists for a methodology for providing a method to form self-aligned SDB for FDSOI devices.

SUMMARY

An aspect of the present disclosure is a method of forming an SDB in planar gate first FDSOI device wherein SDB is self-aligned to a dummy gate.

Another aspect of the present disclosure is a planar gate first FDSOI device including an SDB that is self-aligned to a dummy gate.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: providing a plurality of gates over a SOI layer above a BOX layer, each gate having a pair of sidewall spacers and a cap layer, and a raised S/D epitaxial regions over the SOI layer between each gate; removing a gate of the plurality of gates and a portion of the SOI layer exposed by the removing of the gate, and a portion of the BOX layer underneath the SOI layer, the removing forms a trench; forming a liner of a first dielectric material over and along sidewalls of the trench; and filling the trench with a second dielectric material.

Aspects of the present disclosure include forming a sacrificial layer over the raised S/D epitaxial regions, the sidewall spacers and the cap layer by a spin-on process or a plasma enhanced chemical vapor deposition (PECVD) process prior to removing the gate; and planarizing the sacrificial layer down to the cap layer. Another aspect includes removing the cap layer and a portion of the sidewall spacers, forming a trench. Further aspects include forming a photoresist layer over the sacrificial layer, the sidewall spacers and the plurality of gates; patterning the photoresist layer using a RX cut mask, exposing the gate, the pair of sidewall spacers and adjacent portions of the sacrificial layer; removing the gate, and etching a portion of the pair of sidewall spacers, the portion of the SOI layer and the portion of the BOX layer exposed by the removal of the gate; and removing the photoresist layer and the sacrificial layer, respectively. Additional aspects include forming the liner of the first dielectric material over and along sidewalls of the trench and the second dielectric material filling the trench by: forming a first spacer liner over the raised S/D epitaxial regions, the plurality of gates and over and along sidewalls of the sidewall spacers and the trench, wherein the first spacer liner includes oxide; forming a second spacer layer over the first spacer liner, wherein the second spacer layer includes nitride; etching portions of the second spacer layer, forming a second spacer structure adjacent to portions of the first spacer liner that line the sidewall spacers; filling the trench; and forming a silicide in portions of the raised S/D epitaxial regions and each gate. Other aspects include forming a barrier layer over the raised S/D epitaxial regions, the first spacer liner, the second spacer structure, the sidewall spacers and the plurality of gates; forming an interlayer dielectric (ILD) layer over the barrier layer; planarizing the ILD layer; forming a pair of trenches through the ILD layer and barrier layer down to the silicide in portions of the raised S/D epitaxial regions on opposite sides of the gate; forming a liner layer in and along sides of each trench; filling the trench with titanium nitride (TiN), tantalum nitride (TaN) or tungsten (W); and planarizing the liner layer and W down to the ILD layer. Additional aspects include the liner layer which includes TiN or TaN. Other aspects include the sacrificial layer which includes an energy removal film (ERF) or a spin-on-hardmask (SOH). Further aspects include removing the cap layer and the portion of the pair of sidewall spacers by: applying a wet etch process, a RIE process or a selective etch process in the removing.

Another aspect of the present disclosure is a device including a BOX layer over a Si substrate; a SOI layer over a portion of the BOX layer; a pair of gates over the SOI layer and laterally separated, each gate including a gate oxide layer over the SOI layer, a gate electrode layer over the gate oxide layer, an amorphous Si layer over the gate electrode layer, and a pair of first sidewall spacers; and a dummy gate over a portion of the BOX layer with a u-shaped spacer liner and a spacer structure between a pair of second sidewall spacers, the dummy gate laterally separated from and situated in-between the pair of gates.

Aspects of the device include a distance between the pair of second sidewall spacers of the dummy gate which is equal to a distance between the pair of first sidewall spacers of the pair of gates neighboring the dummy gate. Another aspect includes the gate oxide layer which includes silicon dioxide ($SiO_2$), silicon oxynitride (SiON) or a metal oxide, and wherein the metal oxide includes hafnium oxide ($HfO_2$), hafnium silicate (HfSiOx), hafnium nitride silicate (HfSiOxNy), zirconium dioxide ($ZrO_2$), titanium dioxide ($TiO_2$), aluminium oxide ($Al_2O_3$) or lanthanum oxide ($La_2O_5$). Other aspects include the gate electrode layer which includes TiN, aluminium (Al), W, molybdenum (Mo), tantalum (Ta), TaN, tantalum carbon nitride (TaCN), tantalum silicon nitride (TaSiN), rhenium (Re) or ruthenium (Ru). A further aspect includes the u-shaped spacer liner and the pair of first sidewall spacers including oxide. Another aspect includes the spacer structure including nitride. Other aspects include a raised S/D epitaxial regions over the SOI layer between and adjacent to the pair of first sidewall spacers and the pair of second sidewall spacers; a silicide layer in a portion of each raised S/D epitaxial regions and the pair of gates; a third spacer over non-silicide portion of each raised S/D epitaxial regions and along a sidewall portion of the pair of first sidewall spacers and the pair of second sidewall spacers; a fourth spacer over and along sidewall portion of the third spacer; a barrier layer over the raised S/D epitaxial regions, the third spacer, the fourth spacer, the pair of gates and the dummy gate; a contact through the barrier layer down to the silicide layer between the dummy gate and each gate of the pair; and an ILD layer over the barrier layer and between and adjacent to the contacts, an upper surface of the ILD layer coplanar with the contacts. A further aspect includes the raised S/D epitaxial region which includes Si, silicon germanium (SiGe), silicon carbide (SiC) or silicon-germanium-carbon (SiGeC).

A further aspect of the present disclosure is a method including: providing a plurality of gates over a SOI layer above a BOX layer over a Si substrate, each gate including a gate oxide layer over the SOI layer, a gate electrode layer over the gate oxide layer, an amorphous Si layer over the gate electrode layer, a pair of sidewall spacers and a cap layer, and a raised S/D epitaxial regions over the SOI layer between each gate; removing a gate of the plurality of gates and a portion of the SOI layer exposed by the removing of the gate, and a portion of the BOX layer underneath the SOI layer by a selective etch process, the removing forms a trench; forming a liner of an oxide over and along sidewalls of the trench; and filling the trench with a second dielectric material.

Aspects of the present disclosure includes: forming a sacrificial layer of ERF or SOH over the raised S/D epitaxial regions, the sidewall spacers and the cap layer by a spin-on process or a PECVD process prior to removing the gate; planarizing the sacrificial layer down to the cap layer; and removing the cap layer and a portion of the sidewall spacers by a wet etch process, a RIE process or a selective etch process, forming a trench. Another aspect includes: forming a photoresist layer over the sacrificial layer, the sidewall spacers and the plurality of gates; patterning the photoresist layer using a RX cut mask, exposing the gate, the pair of sidewall spacers and adjacent portions of the sacrificial layer; etching respective oxide layer, gate electrode layer and amorphous Si layer of the gate, a portion of the pair of sidewall spacers and the portion of the SOI layer and the BOX layer; and removing the photoresist layer and the sacrificial layer, respectively.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of poor EPI growth and silicide formation, CA punch down and SiGe channel strain loss attendant upon forming STI regions during scaling of ICs. The problem is solved, inter alia, by forming an SDB that is self-aligned to a dummy gate.

Methodology in accordance with embodiments of the present disclosure includes providing a plurality of gates over a SOI layer above a BOX layer, each gate having a pair of sidewall spacers and a cap layer, and a raised S/D epitaxial regions over the SOI layer between each gate. A gate of the plurality of gates is removed and then a portion of the SOI layer exposed by the removing of the gate is removed, and a portion of the BOX layer underneath the SOI layer is removed, the removing forms a trench. A liner of a first dielectric material is formed over and along sidewalls of the trench, and the trench is filled with a second dielectric material.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
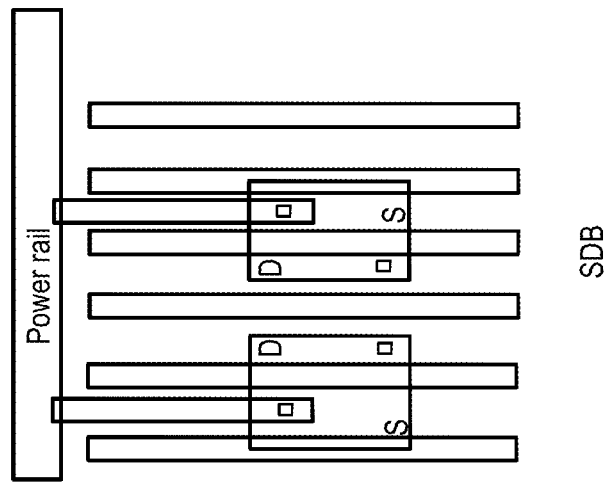
FIG. 1A illustrates a top-view of DDB and SDB.
Figure 1A:
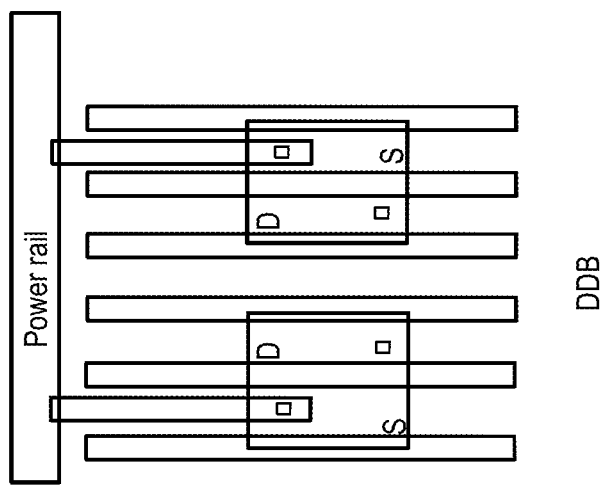
Figure 1B:
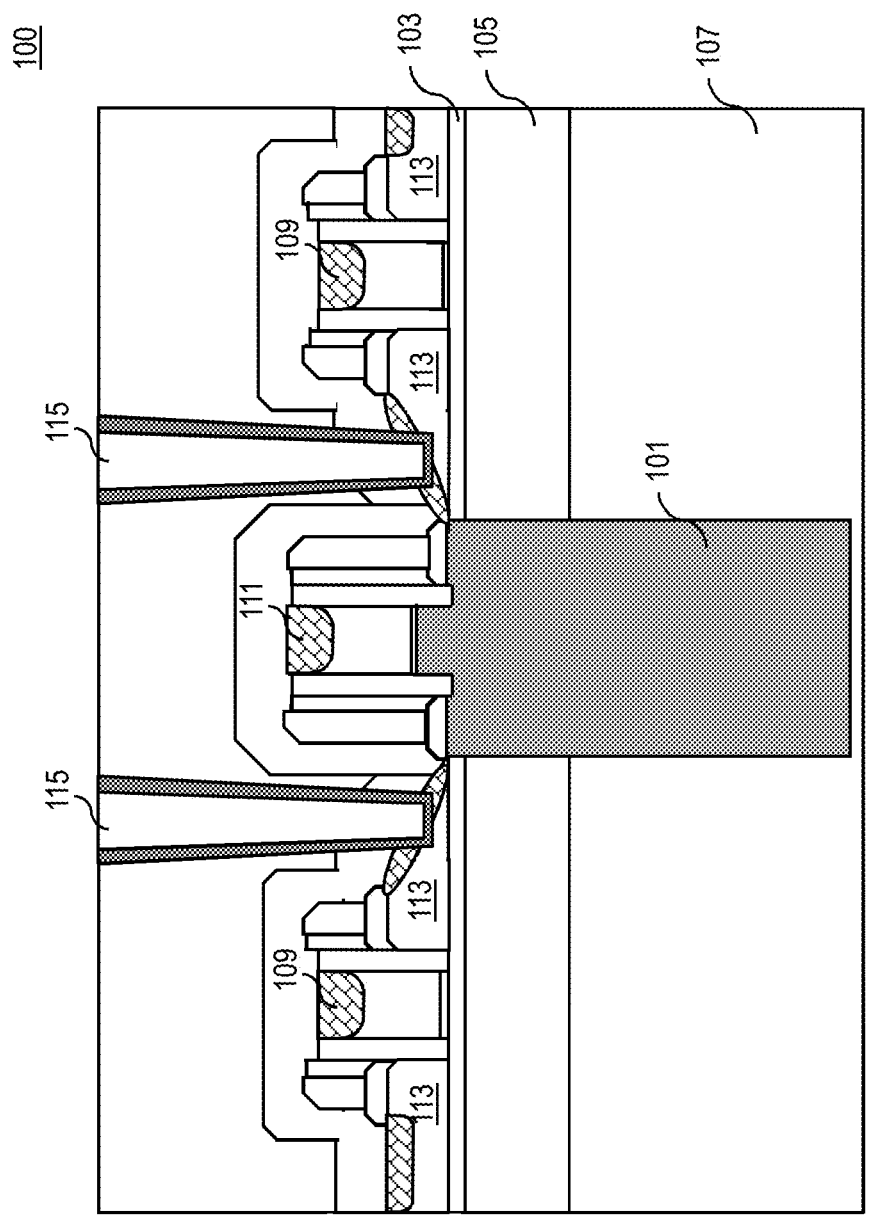
FIG. 1B schematically illustrates a cross-sectional view of a background SDB device.
Figure 2:
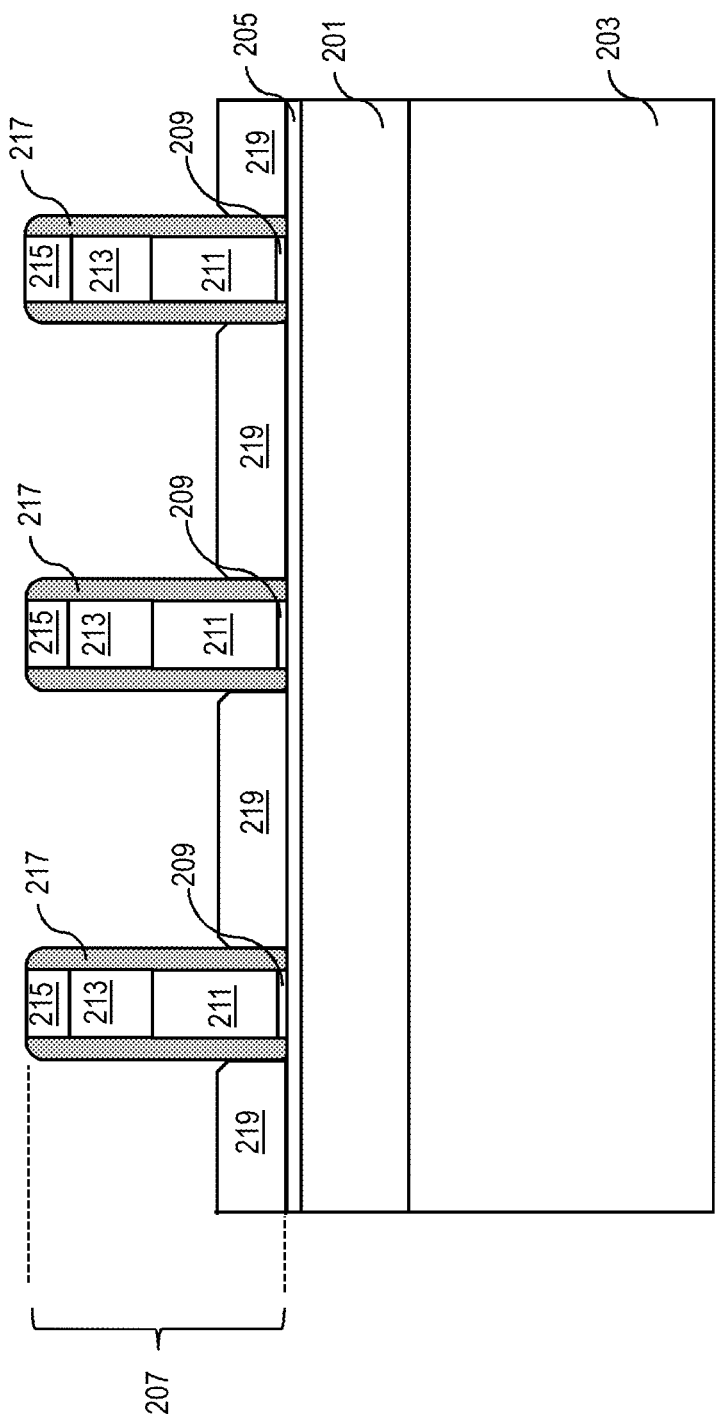
FIGS. 2 through 13 schematically illustrate cross-sectional views of a process flow for forming an SDB that is self-aligned to a dummy gate, in accordance with an exemplary embodiment.

FIGS. 2 through 13 schematically illustrate cross-sectional views of a process flow for forming an SDB that is self-aligned to a dummy gate, in accordance with an exemplary embodiment. Referring to FIG. 2, a BOX layer 201 is provided over a Si substrate 203 with a SOI layer 205. A plurality of gate structure 207 is formed over the SOI layer 205, each gate structure 207 includes a gate oxide layer 209, a gate electrode layer 211, an amorphous Si layer 213, a cap layer 215 and a pair of spacers 217. In one instance, the gate oxide layer 209 includes but is not limited to a very thin $SiO_2$, SiON or a metal oxide, and wherein the metal oxide includes but is not limited to $HfO_2$, HfSiOx, HfSiOxNy, $ZrO_2$, $TiO_2$, $Al_2O_3$ or $La_2O_5$. In another instance, a gate electrode layer 211 includes but is not limited to TiN, Al, W, Mo, Ta, TaN, TaCN, TaSiN, Re or Ru. In a further instance, the amorphous Si layer 213 is formed, e.g., by low pressure chemical vapor deposition (LPCVD), over the gate electrode layer 211. In one instance, a cap layer 215 is formed, e.g., of a SiN-based hard mask or the like, over the amorphous Si layer 213. In a further instance, the spacers 217 include two or more layers of $SiO_2$, $Si_3N_4$, silicon boron nitride (SiBN), or SiON. The cap layer 215 and the spacers 217 prevent unwanted epitaxial growth on the sidewalls and the top surfaces of the gate structure 207. Further, a raised S/D epitaxial region 219 is formed, e.g., of SiGe, SiC and SiGeC by an epitaxy (Epi) process which has selective growth with respect to $SiO_2$ and SiN, over portions of the SOI layer 205 between and adjacent to the spacers 217 for gate patterning. Optionally, N-type and P-type dopants can be in situ incorporated into the epitaxial layer to create S/D transistor regions. It is contemplated that the BOX layer 201 may be a conventional BOX layer or an ultra-thin BOX (UTBOX) layer as commonly used in UTSOI devices.

Figure 3:
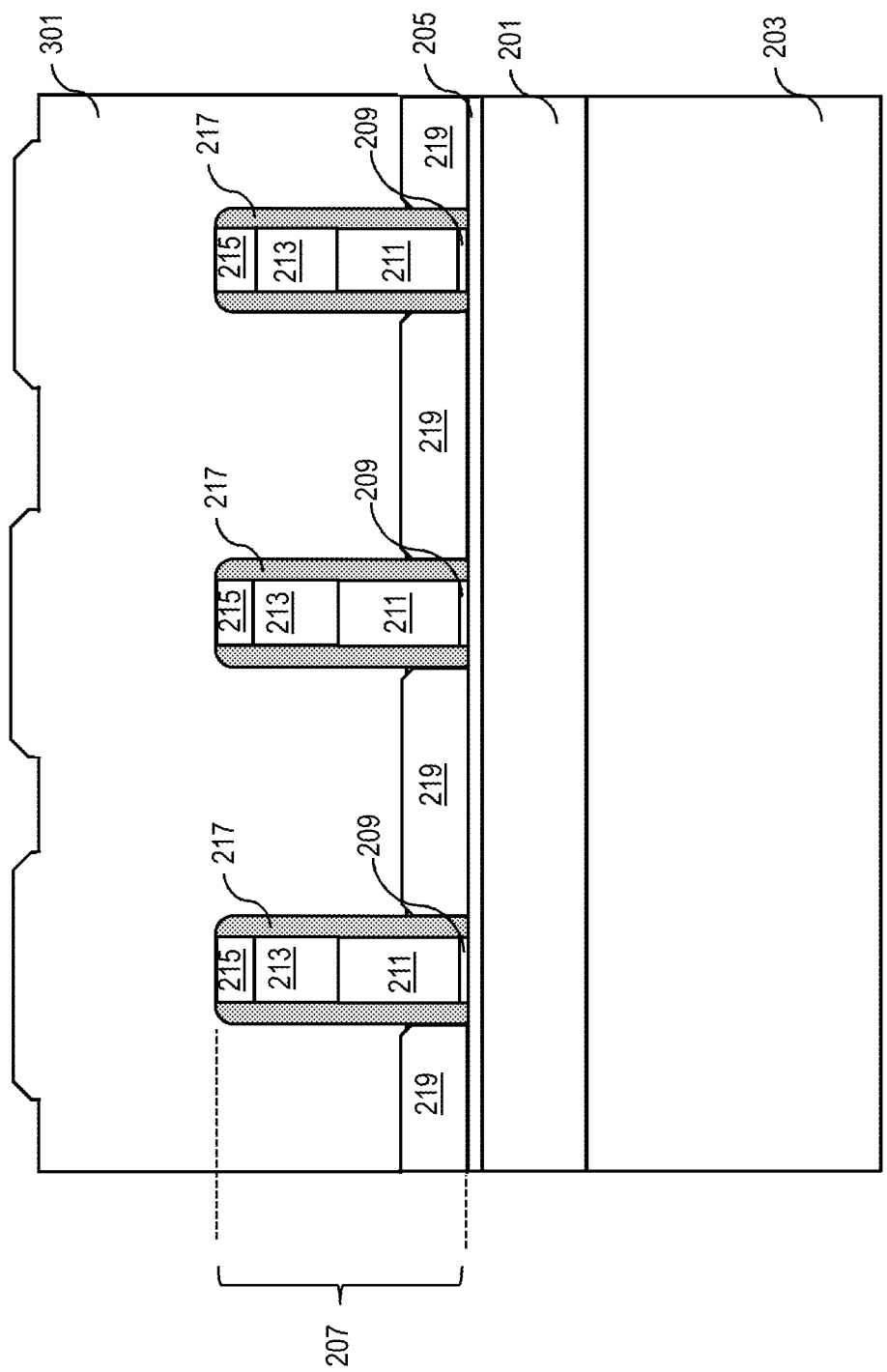
Figure 4:
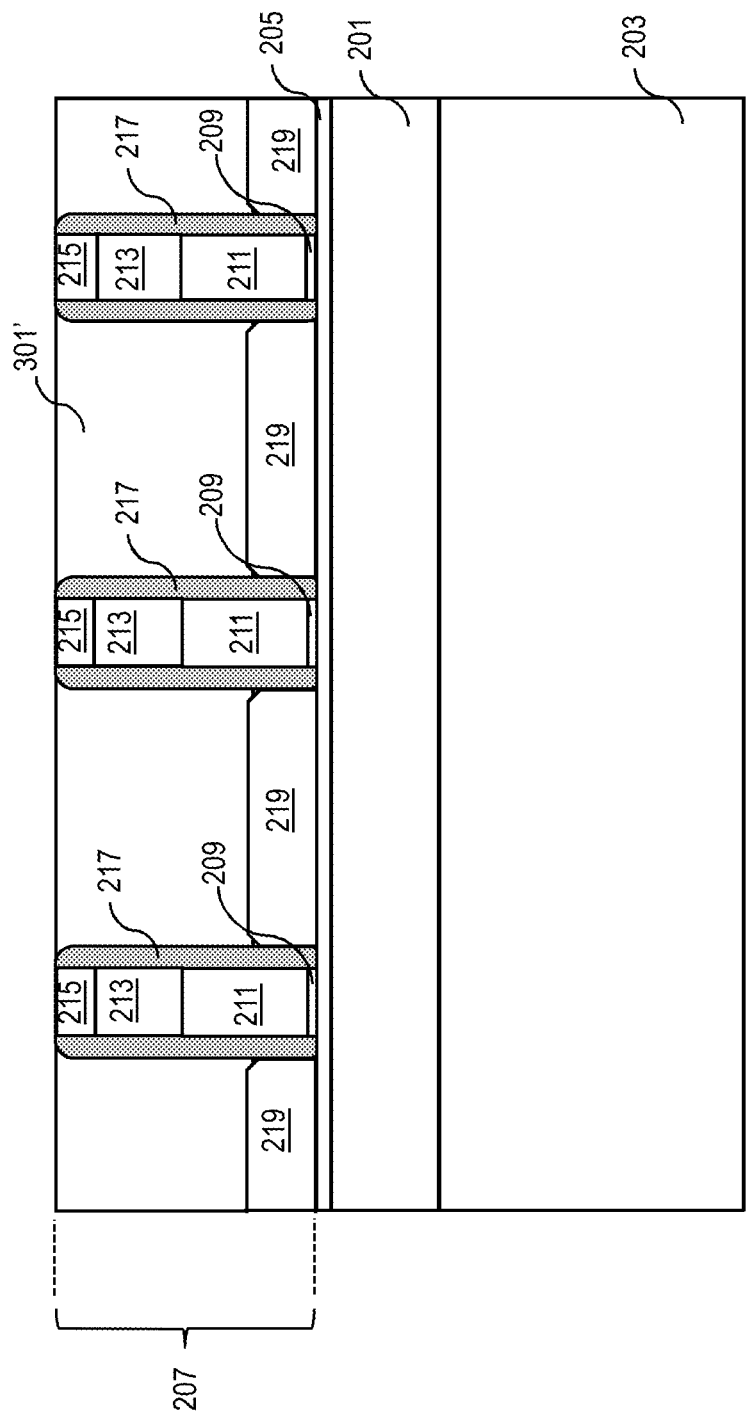
Figure 5:
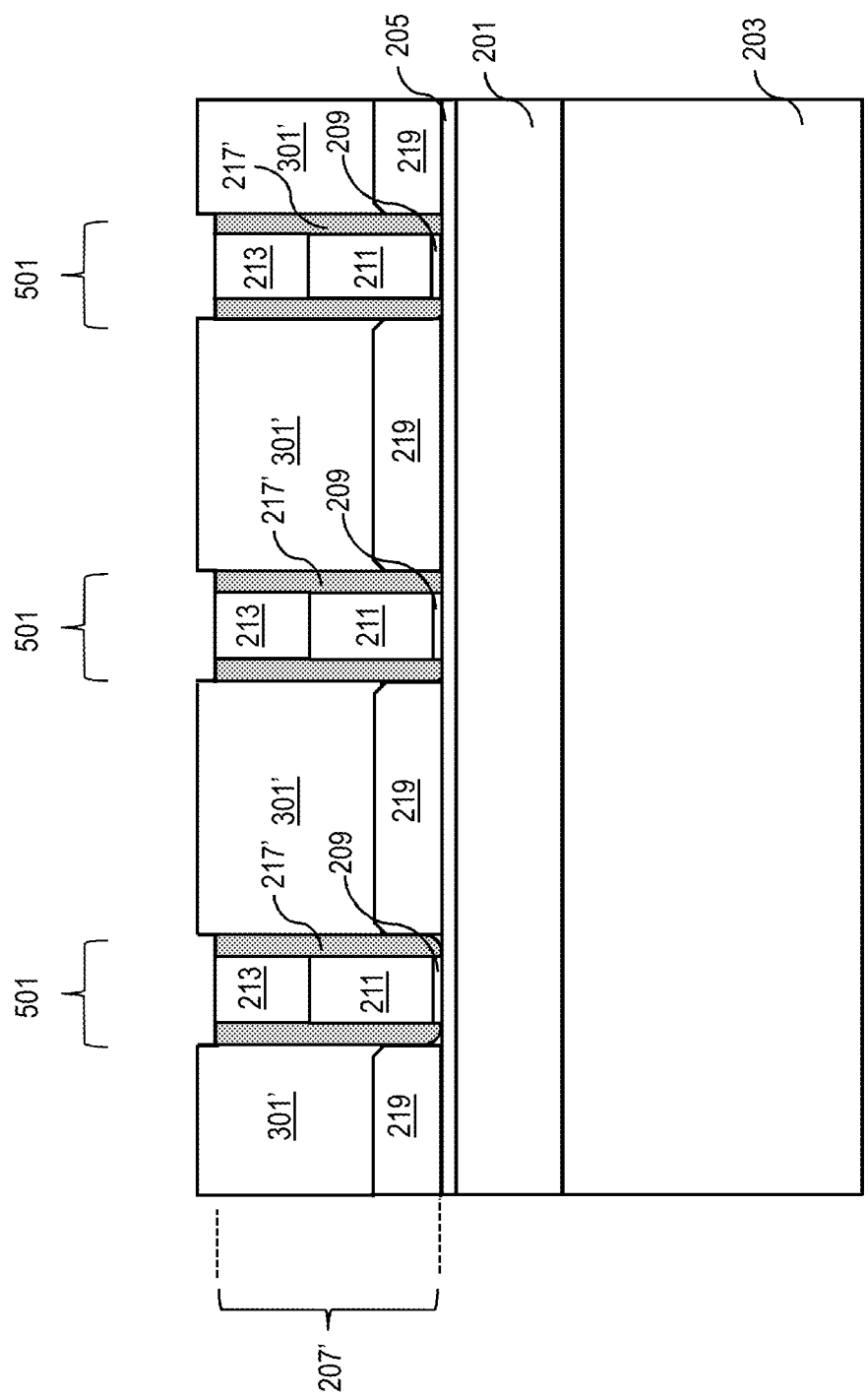

As illustrated in FIG. 3, a sacrificial layer 301 is formed, e.g., of ERF, SOH or like materials, over the raised S/D epitaxial regions 219, spacers 217 and cap layer 215 by PECVD. Next, the sacrificial layer 301 is planarized, e.g., by chemical mechanical planarization (CMP) or like process, or etched, forming a sacrificial layer 301' with an upper surface that is substantially coplanar to the upper surface of the cap layer 215, as depicted in FIG. 4. In one instance, a sacrificial layer 301 formed of SOH material is deposited by a spin-on process, and is etched back by RIE to expose the cap layer 215. Referring to FIG. 5, the cap layer 215 and a portion of the spacers 217 are removed, e.g., by wet etch process, a RIE process or a selective etch process, forming a trench 501, spacers 217' and gate structure 207'.

Figure 6:
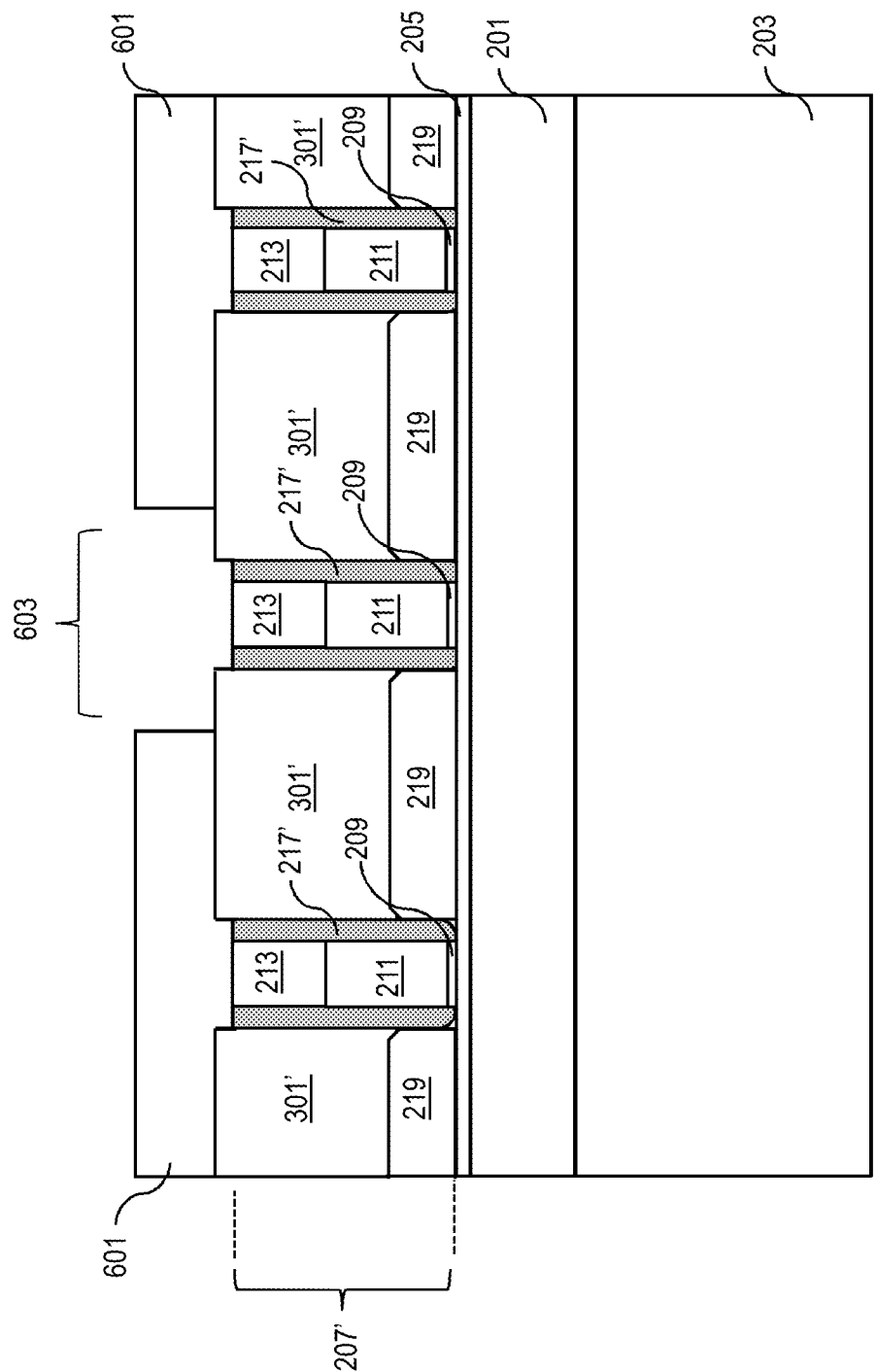
Figure 7:
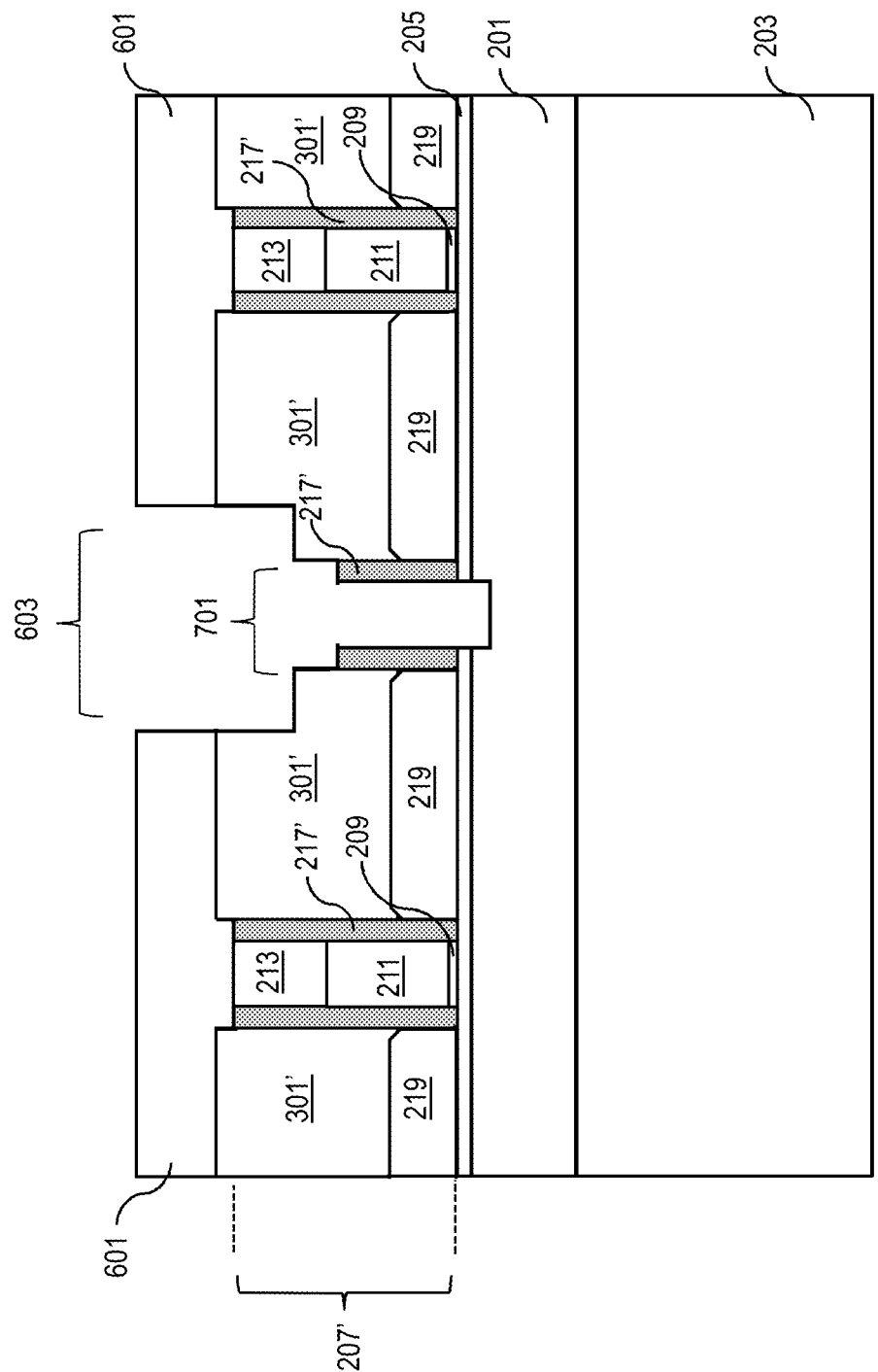
Figure 8:
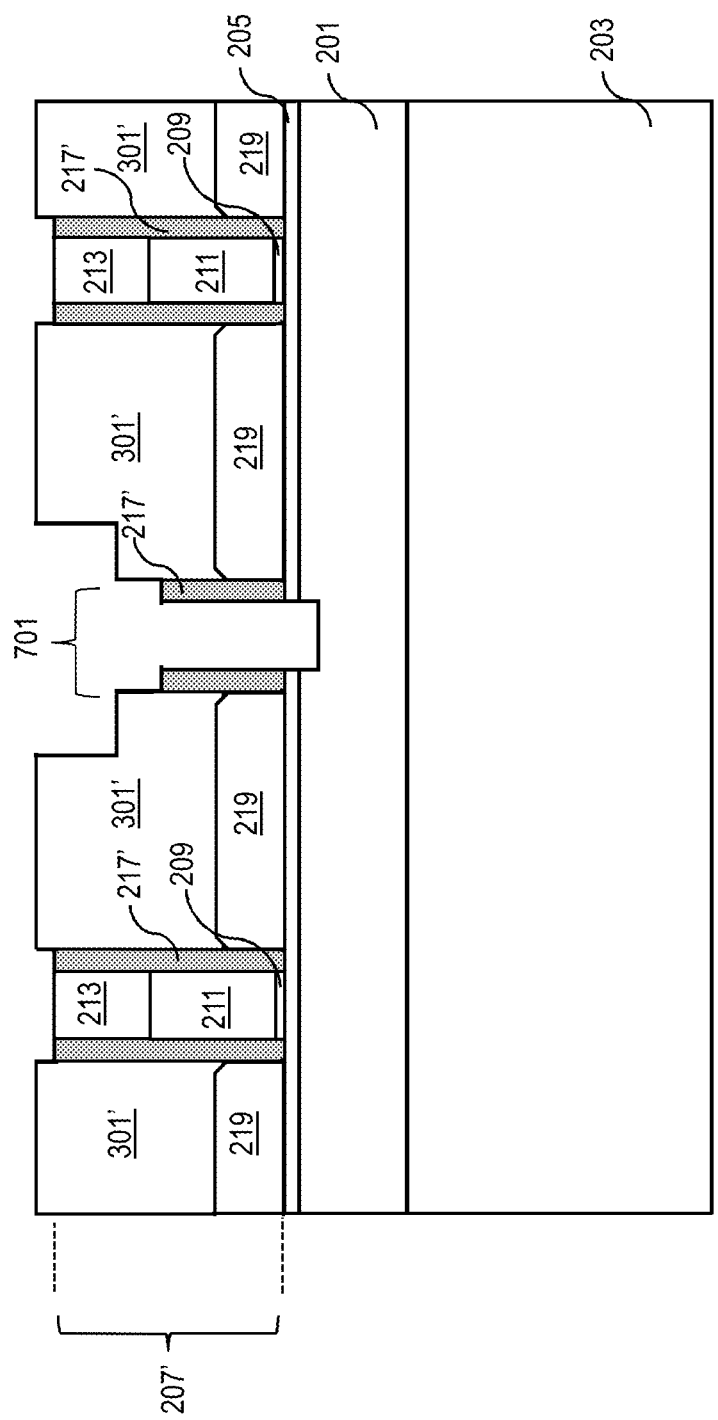
Figure 9:
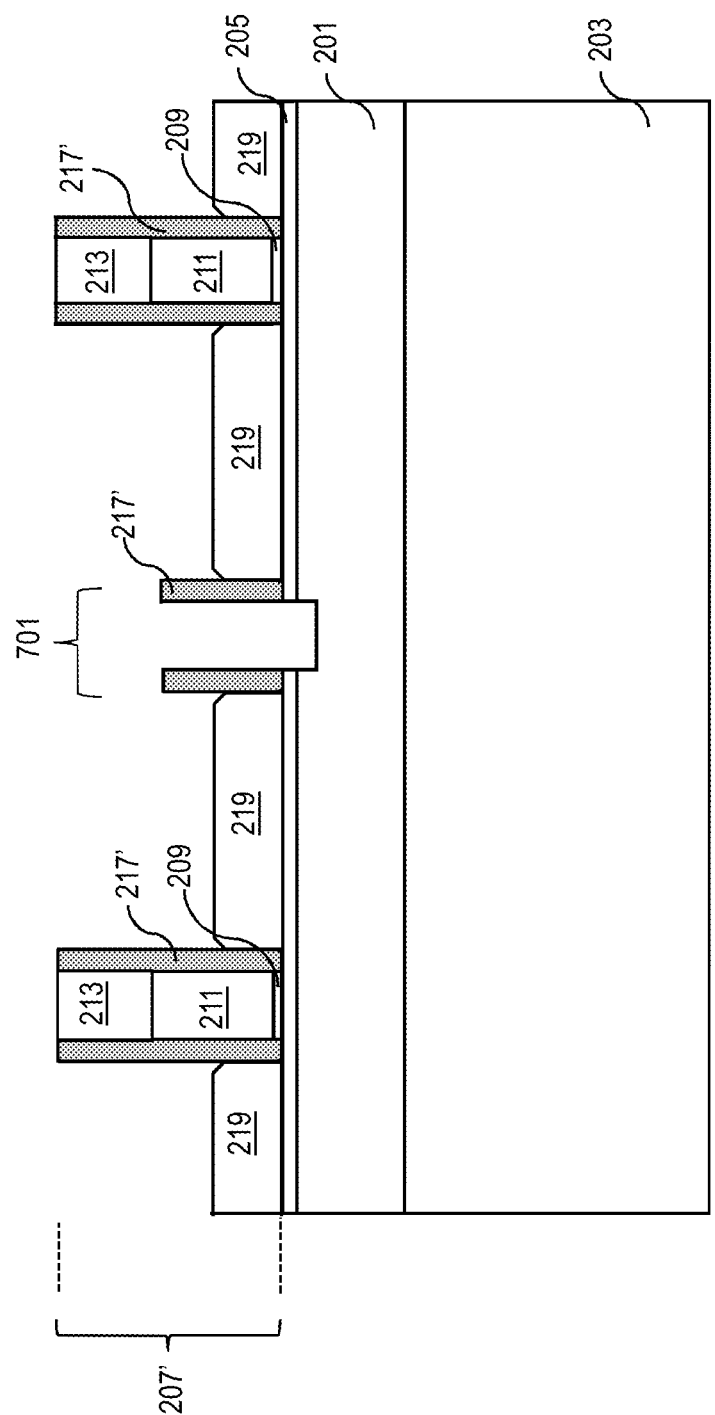

Thereafter, a photoresist layer 601 is formed over the sacrificial layer 301', spacers 217' and amorphous Si layer 213, as depicted in FIG. 6. Then, a trench 603 is formed through the photoresist layer 601 using photolithography patterning with RX cut mask, exposing gate 207' at the center (a dummy gate) and adjacent portions of the sacrificial layer 301'. In one instance, patterning with RX cut mask includes forming an RX cut mask over portions of a fin that are to be retained and expose portions that are to be removed. Then, during an RX cut process the exposed material above the fin is removed to reveal upper surface of the underlying fin portions that are to be removed. As illustrated in FIG. 7, respective amorphous Si layer 213, gate electrode layer 211 and gate oxide layer 209, and respective portions of the spacers 217, SOI layer 205 and BOX layer 201 are removed, e.g., by a RIE process, or other selective etch processes, forming a second trench 701. Referring to FIG. 8, the photoresist layer 601 is then removed. Next, the sacrificial layer 301' is removed, e.g., by RIE or an ultraviolet (UV) curing process at 400° C., as depicted in FIG. 9.

Figure 10:
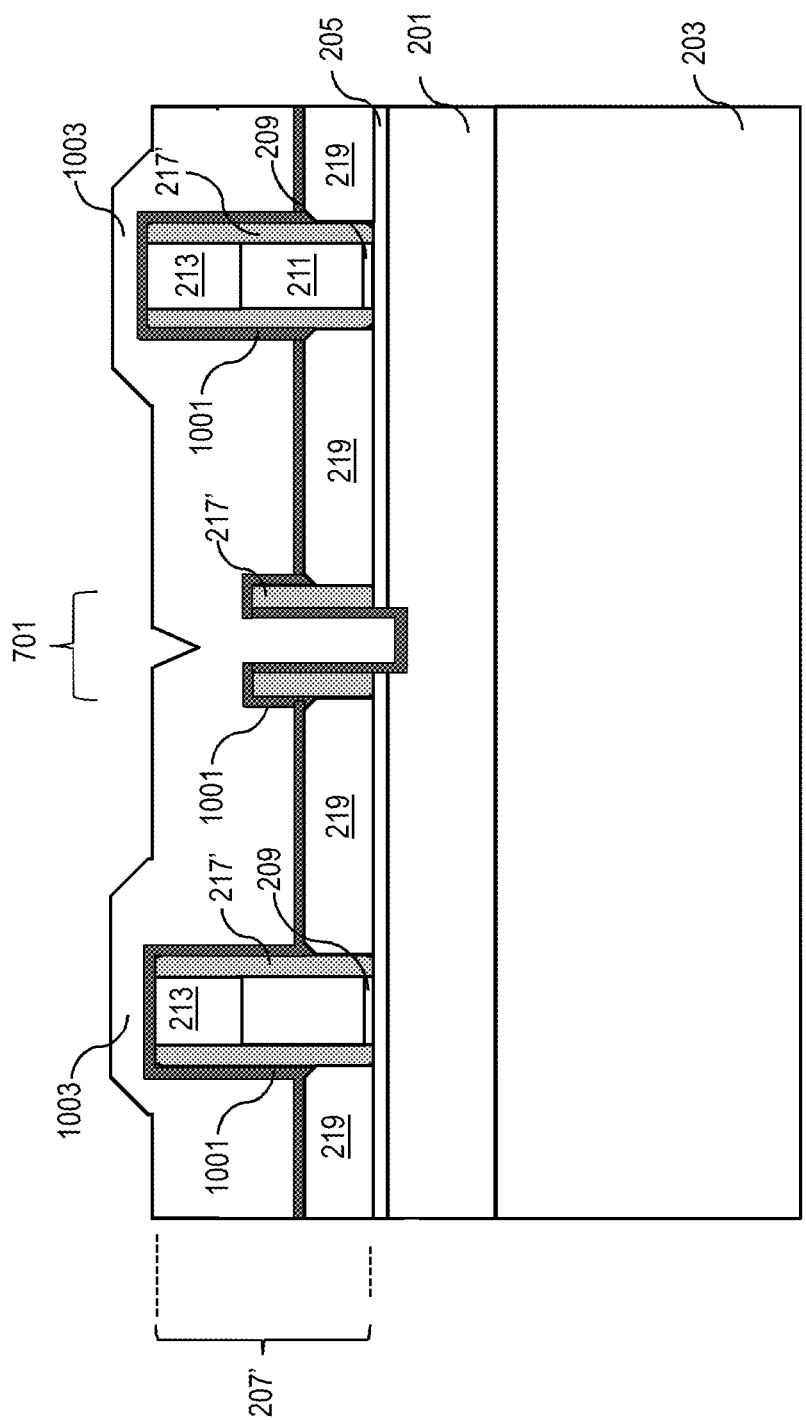
Figure 11:
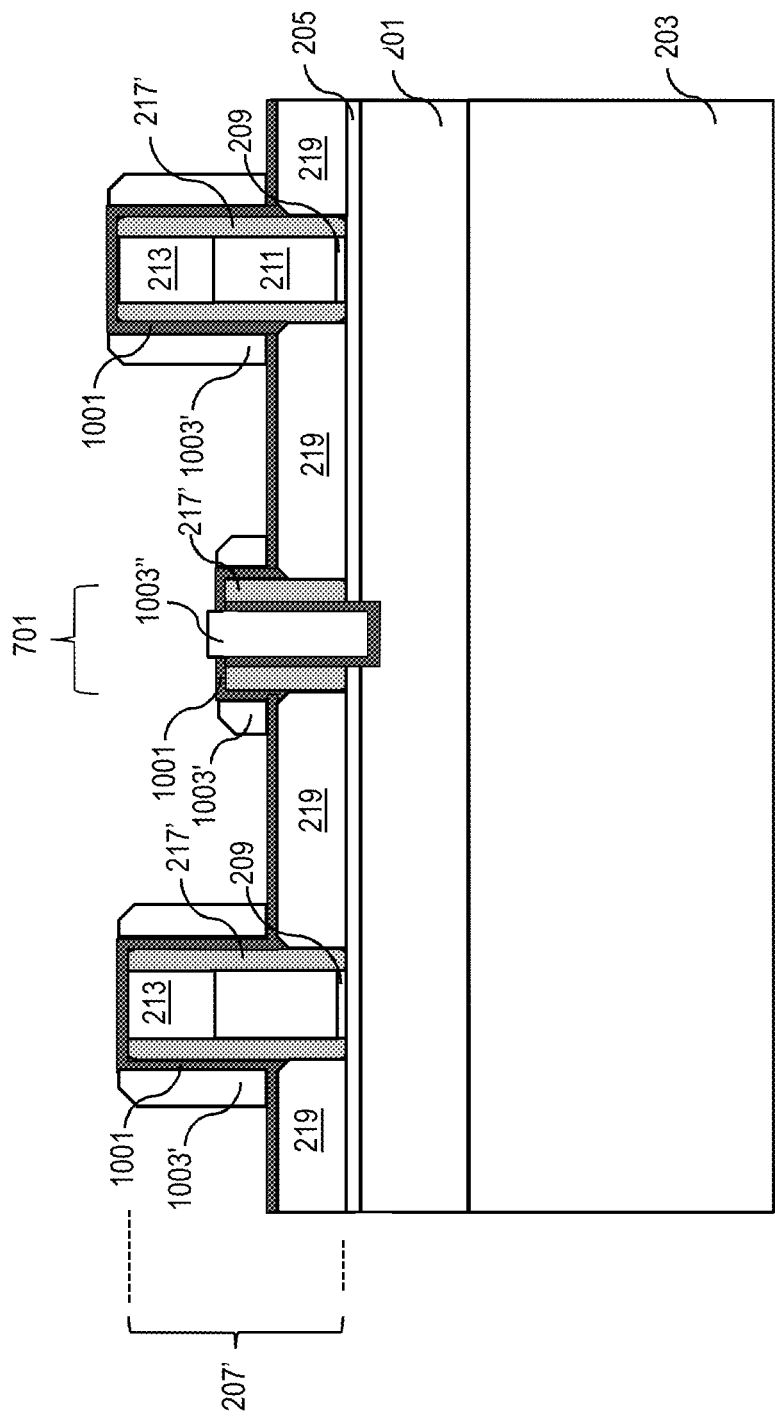
Figure 12:
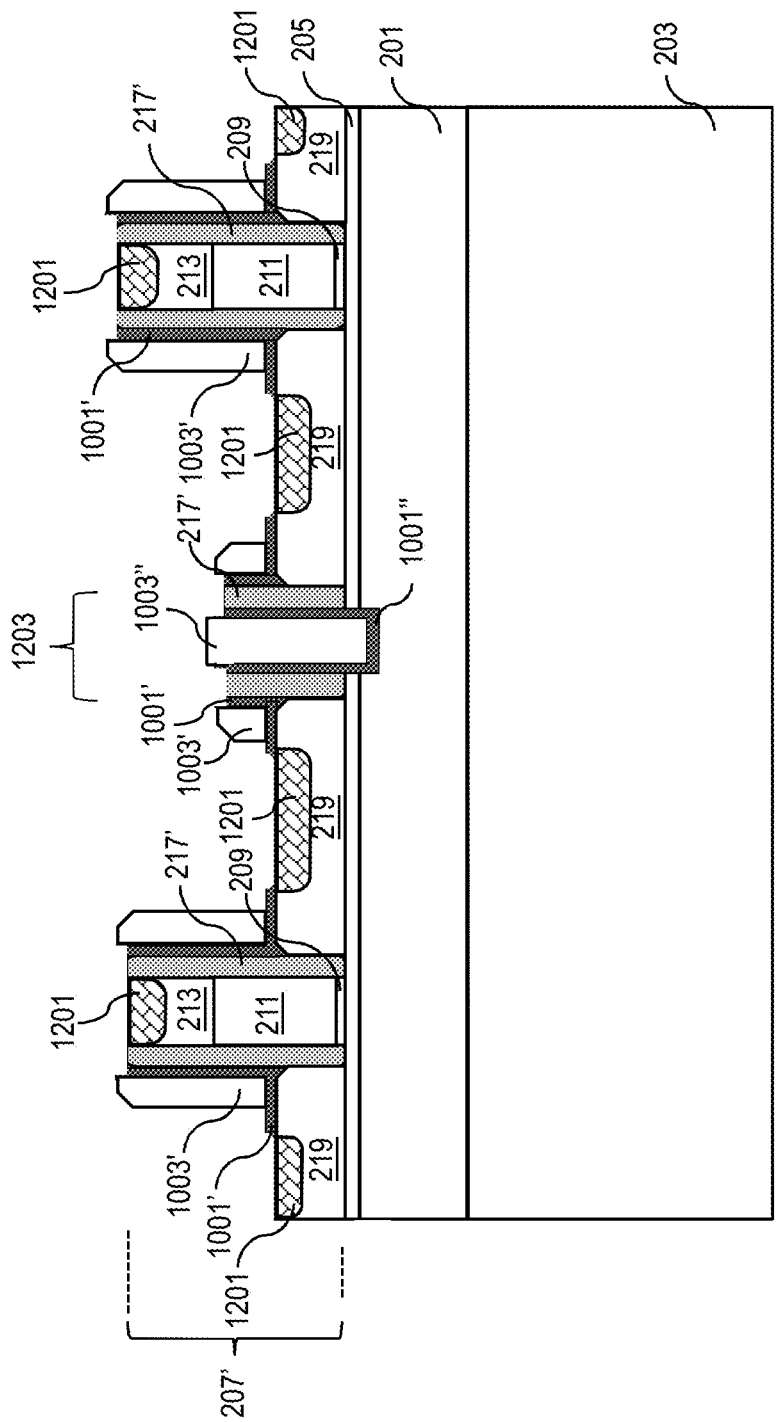

Referring to FIG. 10, a first spacer liner 1001 is conformally formed, e.g., of oxide or like dielectric materials by PECVD or CVD, over the raised S/D epitaxial regions 219, spacers 217', the gates structure 207' and in the trench 701. Subsequently, a second spacer layer 1003 is formed, e.g., of nitride or like dielectric materials by PECVD or CVD, over the first spacer liner 1001. Next, portions of the second spacer layer 1003 are etched, e.g., by RIE, forming a second spacer 1003' over and on sidewall portions of the first spacer liner 1001 and a spacer structure 1003" including dielectric material in the trench 701, as depicted in FIG. 11. Referring to FIG. 12, a pre-cleaning is performed on the first spacer liner 1001, spacers 217' and amorphous Si layer 213, and a silicide 1201 is formed in portions of the raised S/D epitaxial regions 219 and each of the gate structure 207', forming each first spacer 1001' and a u-shaped spacer liner 1001" over and along sidewalls of the trench 701. In this instance, the u-shaped spacer liner 1001" and the spacer structure 1003" form the dummy gate 1203.

Figure 13:
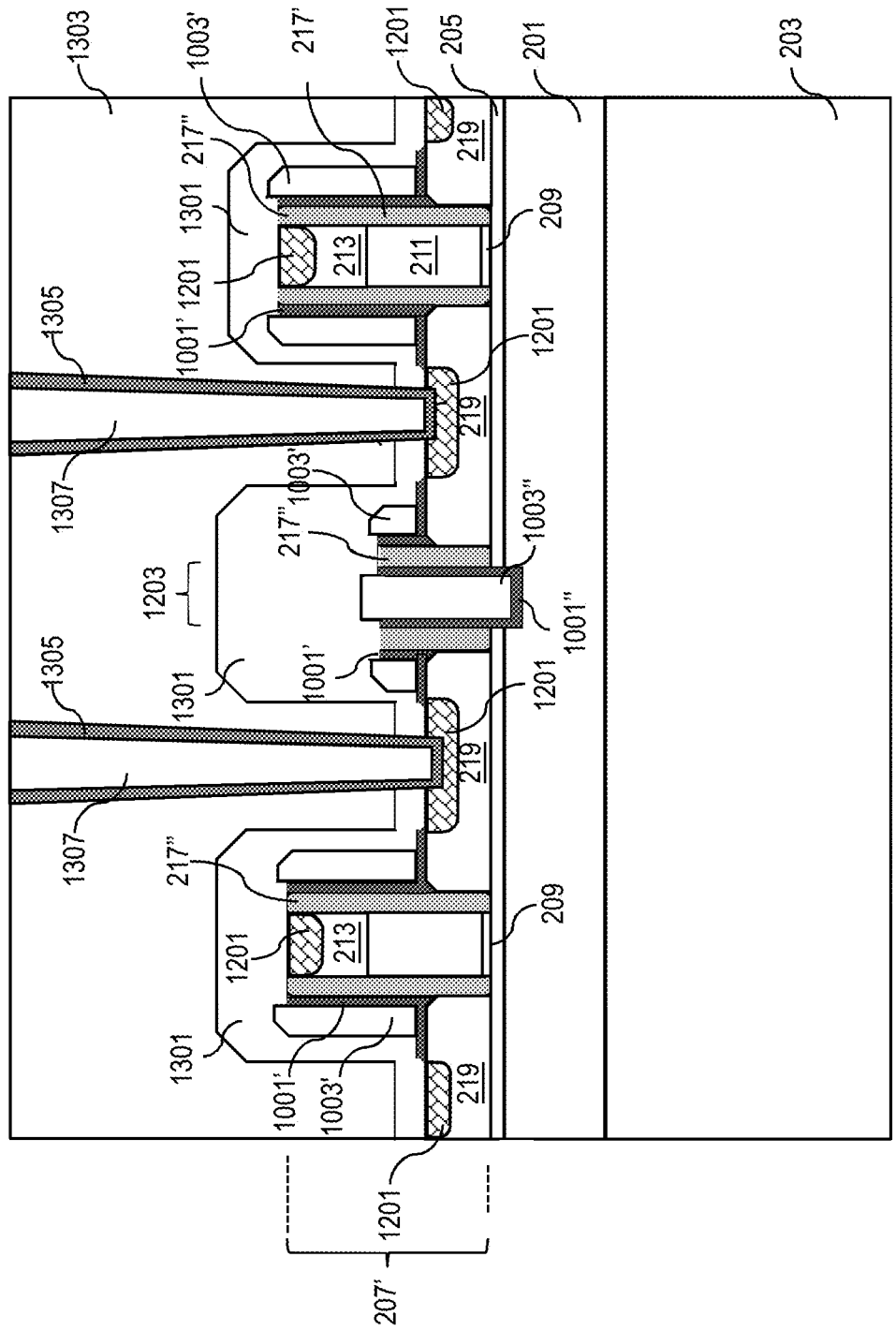

As illustrated in FIG. 13, a barrier layer 1301 is formed over the SOI layer 205. Next, an ILD layer 1303 is formed over the barrier layer 1301. Then, the ILD layer 1303 is planarized, e.g., by CMP. Subsequently, a pair of trenches (not shown for illustrative convenience) are formed, e.g., by RIE, through the ILD layer 1303 and barrier layer 1301 down to the silicide 1201 in portions of the raised S/D epitaxial regions 219 on opposite sides of the dummy gate 1203. Then, liners 1305 are formed, e.g., of TiN or TaN, in and along the sidewalls of the trenches. Next, the trenches are filled with metal layer 1307, e.g., formed of W. Subsequently, the liners 1305 and metal layer 1307 are planarized down to the ILD layer 1303.

The embodiments of the present disclosure can achieve several technical effects, including improved EPI variation, silicide formation and contact landing. Further, a SDB is self-aligned to a dummy gate and there is no STI bounded EPI growth which minimizes strain loss. In addition, the present disclosure allows for high quality and facet-free S/D EPI formation and minimizes strain loss in the active regions. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of highly integrated semiconductor devices, including FDSOI with HK metal gate and UTSOI with a thin BOX layer.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
a buried oxide (BOX) layer over a silicon (Si) substrate;
a silicon-on-insulator (SOI) layer over a portion of the BOX layer;
a pair of gates over the SOI layer and laterally separated, each gate including a gate oxide layer over the SOI layer, a gate electrode layer over the gate oxide layer, an amorphous Si layer over the gate electrode layer, and a pair of first sidewall spacers;
a dummy gate over a portion of the BOX layer with a u-shaped spacer liner and a spacer structure between a pair of second sidewall spacers, the dummy gate laterally separated from and situated in-between the pair of gates;
a raised source/drain (S/D) epitaxial regions over the SOI layer between and adjacent to the pair of first sidewall spacers and the pair of second sidewall spacers;
a silicide layer in a portion of each raised S/D epitaxial regions and the pair of gates;
a third spacer over non-silicide portion of each raised S/D epitaxial regions and along a sidewall portion of the pair of first sidewall spacers and the pair of second sidewall spacers;
a fourth spacer over and along sidewall portion of the third spacer;
a barrier layer over the raised S/D epitaxial regions, the third spacer, the fourth spacer, the pair of gates and the dummy gate;
a contact through the barrier layer down to the silicide layer between the dummy gate and each gate of the pair; and
an interlayer dielectric (ILD) layer over the barrier layer and between and adjacent to the contacts, an upper surface of the ILD layer coplanar with the contacts.

2. The device according to claim 1, wherein a distance between the pair of second sidewall spacers of the dummy gate is equal to a distance between the pair of first sidewall spacers of the pair of gates neighboring the dummy gate.

3. The device according to claim 1, wherein the gate oxide layer comprises silicon dioxide ($SiO_2$), silicon oxynitride (SiON) or a metal oxide, and wherein the metal oxide comprises hafnium oxide ($HfO_2$), hafnium silicate (HfSiOx), hafnium nitride silicate (HfSiOxNy), zirconium dioxide ($ZrO_2$), titanium dioxide ($TiO_2$), aluminium oxide ($Al_2O_3$) or lanthanum oxide ($La_2O_5$).

4. The device according to claim 1, wherein the gate electrode layer comprises titanium nitride (TiN), aluminium (Al), tungsten (W), molybdenum (Mo), tantalum (Ta), tantalum nitride (TaN), tantalum carbon nitride (TaCN), tantalum silicon nitride (TaSiN), rhenium (Re) or ruthenium (Ru).

5. The device according to claim 1, wherein the u-shaped spacer liner and the pair of first sidewall spacers comprise oxide.

6. The device according to claim 1, wherein the spacer structure comprise nitride.

7. The device according to claim 1, wherein the raised S/D epitaxial region comprises silicon (Si), silicon germanium (SiGe), silicon carbide (SiC) or silicon-germanium-carbon (SiGeC).

* * * * *